United States Patent
Lee

(10) Patent No.: US 8,027,202 B2
(45) Date of Patent: Sep. 27, 2011

(54) METHOD OF PROGRAMMING A FLASH MEMORY DEVICE USING SELF BOOSTING

(75) Inventor: Min Kyu Lee, Gwangju (KR)

(73) Assignee: Hynix Semiconductor Inc., Icheon-si (KR)

( * ) Notice: Subject to any disclaimer, the term of this patent is extended or adjusted under 35 U.S.C. 154(b) by 103 days.

(21) Appl. No.: 12/422,184

(22) Filed: Apr. 10, 2009

(65) Prior Publication Data

US 2009/0257281 A1    Oct. 15, 2009

(30) Foreign Application Priority Data

Apr. 11, 2008  (KR) .................. 10-2008-0033603

(51) Int. Cl.
*G11C 16/04*  (2006.01)
(52) U.S. Cl. ......... 365/185.33; 365/185.22; 365/185.03; 365/185.26
(58) Field of Classification Search ............. 365/185.33, 365/185.22, 185.03, 185.26
See application file for complete search history.

(56) References Cited

U.S. PATENT DOCUMENTS

| | | | |
|---|---|---|---|
| 2007/0025157 A1 | 2/2007 | Wan et al. | |
| 2008/0037327 A1* | 2/2008 | Park et al. | 365/185.19 |
| 2008/0049494 A1 | 2/2008 | Aritome | |
| 2008/0055995 A1 | 3/2008 | Ito | |
| 2009/0296494 A1* | 12/2009 | Lee et al. | 365/189.05 |

FOREIGN PATENT DOCUMENTS

| KR | 1020040086669 A | 10/2004 |
|---|---|---|
| KR | 100764053 B1 | 9/2007 |

* cited by examiner

*Primary Examiner* — Thong Q Le
(74) *Attorney, Agent, or Firm* — Kilpatrick Townsend & Stockton LLP

(57) ABSTRACT

A method of programming a flash memory device controls a channel boosting level to ensure device properties. The flash memory device is programmed in an Incremental Step Pulse Program (ISPP) manner by applying a program voltage to a selected memory cell and a pass voltage to unselected memory cells. The programming is performed by varying the pass voltage so that a gap of a predetermined range is maintained between a channel voltage and a word line voltage of the unselected memory cell.

19 Claims, 5 Drawing Sheets

METHOD OF PROGRAMMING A FLASH MEMORY DEVICE USING SELF BOOSTING

CROSS-REFERENCES TO RELATED APPLICATIONS

The present application claims priority to Korean application number 10-2008-0033603, filed on Apr. 11, 2008, which is incorporated by reference in its entirety.

BACKGROUND OF THE INVENTION

The present invention relates to an operation of a non-volatile memory device, and more particularly, to a method of programming a flash memory device using self boosting.

A flash memory device, particularly a NAND flash memory device, has been increasingly used as a data storage medium. The flash memory device provides high memory density at a relatively low cost. Recently, in order to increase storage capacity on a small chip, a multi-bit cell capable of storing data of more than two bits in one memory cell has been developed. The memory cell of this type is generally called as a Multi-Level Cell (MLC). A Single Level Cell (SLC) includes one memory cell that has two states, i.e. program/erase. The MLC may store data of two bits, three bits, four bits or more with one memory cell. Thus, the MLC can realize a memory capacity of more than twice that of the SLC. The MLC generally has two or more threshold voltage distributions, and also has two or more data storage states corresponding to the threshold voltage distributions.

The NAND flash memory device is erased and programmed using Fowler-Nordheim Tunneling. During programming, a predetermined program voltage is applied to a word line of a selected memory cell and a ground voltage is applied to a bit line. In order to prevent programming an unselected memory cell, a power voltage is applied to the bit line. When the program voltage is applied to the word line of the selected memory cell and the ground voltage is applied to the bit line, a high electric field is formed between a floating gate and a channel of the memory cell. By this electric field, a tunneling, in which electrons of the channel pass through a tunnel oxide layer between the floating gate and the channel, is generated. By the accumulation of the electrons in the floating gate, the threshold voltage (Vt) of the memory cell is increased.

The distribution in the threshold voltage (Vt) of the memory cell in the programmed state in the NAND flash memory device is an important factor that influences performance of the device according to an over program problem and a read margin. The MLC flash memory device is programmed by an Incremental Step Pulse Program (ISPP) method, in which the program voltage is increased step by step according to a program loop. The ISSP method accurately controls the threshold voltage distribution of the memory cell. The program voltage (Vpgm) according to the ISPP method is increased step by step as program loops of a program cycle are repeated. Each program loop includes a program period and a program verify period. The program voltage (Vpgm) is increased by a determined step voltage ($\Delta V_1$), and the program time is maintained at a constant value with respect to each program loop.

In the MLC flash memory device, control for the threshold voltage of the programmed memory cell is a very important factor since the threshold voltage of the programmed memory cell is disposed so as to be spaced apart from each other between a first read voltage and a pass voltage (Vpass). However, it is very difficult to control a disturbance property due to interference between the memory cells. Also, a channel boosting is reduced as a coupling ratio is decreased according to a decrease in the cell size and, thus, it becomes more difficult to ensure the program disturbance property. The program disturbance is generated when the channel boosting is not enough. Particularly, a first word line is additionally subject to the disturbance as Hot Carrier Injection (HCI) by Gate Induced Drain Leakage (GIDL) is generated when channel boosting is too high.

SUMMARY OF THE INVENTION

Embodiments of the present invention are directed to a method of programming a flash memory device capable of controlling a channel boosting level to ensure device properties by varying a pass voltage applied to a word line of an unselected memory cell.

In one embodiment, a method of programming a flash memory device programs the flash memory device in an Incremental Step Pulse Program (ISPP) manner by applying a program voltage to a selected memory cell and a pass voltage to an unselected memory cell. The programming is performed by varying the pass voltage so that a gap of a predetermined range is maintained between a channel voltage and a word line voltage of the unselected memory cell.

The pass voltage is varied relative to a level of the program voltage. Preferably, the pass voltage is increased by a first step voltage when the level of the program voltage is higher than 1.9 V.

The pass voltage is varied relative to a number of times that a program loop is performed with respect to the selected memory cell. Preferably, the pass voltage is increased by a first step voltage after half of the total number of the program loops is performed.

In another embodiment, a method of programming a flash memory device includes programming a selected memory cell by applying a program voltage to the selected memory cell and a pass voltage to an unselected memory cell; verifying the programmed state of the selected memory cell; determining whether the level of the program voltage is higher than a first voltage when a memory cell is not programmed to a target level; and re-programming the memory cell by increasing the program voltage by a first step voltage when the program voltage is not higher than the first voltage, and increasing the program voltage and the pass voltage by the first step voltage and a second step voltage, respectively, when the program voltage is higher than the first voltage.

In a further embodiment, a method of programming a flash memory device includes programming a selected memory cell by applying a program voltage to the selected memory cell and a pass voltage to an unselected memory cell; verifying the programmed state of the selected memory cell; determining a number of times that a program loop is performed when a memory cell is not programmed to a target level; and re-programming the memory cell by increasing the program voltage by a first step voltage when the number of times that the program loop is performed is not larger than a first number, and increasing the program voltage and the pass voltage by the first step voltage and a second step voltage, respectively, when the number of times that the program loop is performed is larger than the first number.

The programming of the selected memory cell includes: turning on a drain selection transistor and turning off a source selection transistor; performing a precharge by applying a power voltage to a bit line; floating a channel of the memory cell by turning off the drain selection transistor; and applying the program voltage to the selected memory cell and the pass voltage to the unselected memory cell.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF SPECIFIC EMBODIMENTS

Figure 1:
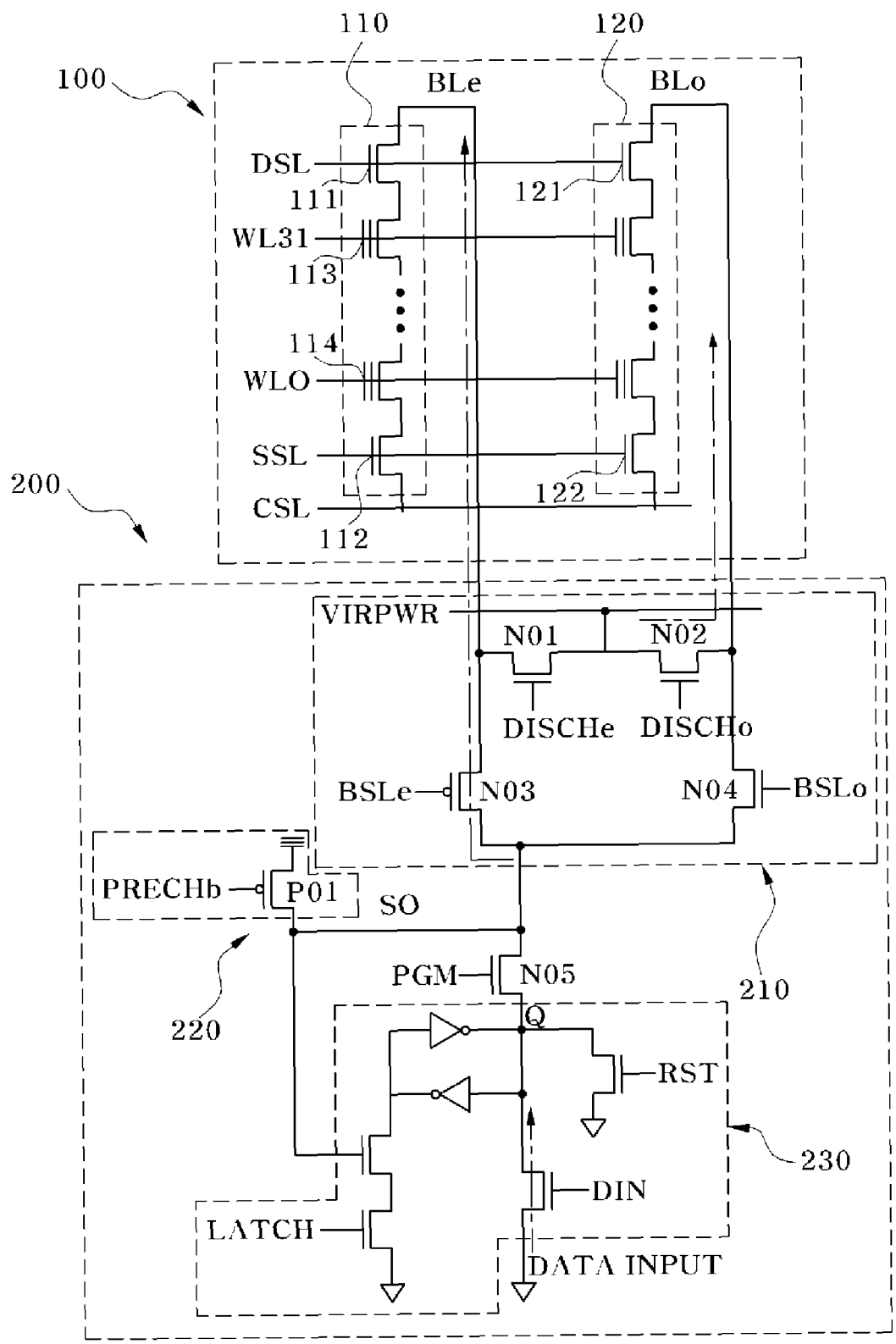
FIG. 1 is a view illustrating a structure of a cell string and a page buffer of a typical NAND flash memory device.

Hereinafter, exemplary embodiments of the present invention will be described with reference to accompanying drawings. However, the embodiments are for illustrative purposes only and are not intend to limit the scope of the invention.

In a program/erase operation of a NAND flash memory device, a cell of data "1" means an erased cell of which a threshold voltage is negative (−) and a cell of data "0" means a programmed cell of which a threshold voltage is positive (+). An erase operation of the NAND memory device is performed on a per block basis. When one block is erased, all cells in the block become a state of data "1". A user can program data of "0" or "1" in a memory cell by programming operation in the state that all the data in the block is erased. The operation of writing the data "0" in the memory cell means to program the memory cell to change the threshold voltage of the memory cell from the negative (−) to the positive (+). The operation of writing the data "0" is the operation of changing the initial state of the memory cell, whereas the operation of writing the data "1" is to maintain the threshold voltage of the memory cell in the erased state. That is to say, an operation of preventing the memory cell from being programmed is performed.

In order to change the threshold voltage of the memory cell from the negative (−) to the positive (+) for writing the data "0" in the memory cell, it is necessary to make a voltage difference of more than a certain level between a floating gate and a channel to generate Fowler-Nordheim Tunneling. To this end, a program voltage (Vpgm) of about 18 V is applied to a word line of a selected memory cell and 0 V is applied to the channel. A ground voltage is applied to a bit line. When the program voltage (Vpgm) is applied to the word line of the selected memory cell and the ground voltage is applied to the bit line, a high electric field is formed between the floating gate and the channel of the memory cell. The tunneling in which electrons of the channel pass through a tunnel oxide layer between the floating gate and the channel is generated by this electric field, and the threshold voltage (Vt) of the memory cell is raised to be changed to the positive (+) by accumulation of the electrons in the floating gate.

In order to write the data "1" in the memory cell, it is necessary to make the voltage difference between a floating gate and the channel small to prevent generation of the Fowler-Nordheim Tunneling so that the state of the memory cell is not changed. To this end, when the voltage of 18 V is applied to the word line of the selected memory cell, the voltage of the channel should be a program inhibition voltage, i.e. a voltage of about 8 V. If the voltage of the channel is not high enough, a program disturbance is increased since the voltage difference between the floating gate and the channel of the memory cell becomes large.

Using self-boosting, it is possible to obtain the program inhibition voltage by applying only a power voltage (Vcc) to the bit line while storing the data "1" in the memory cell.

FIG. 1 is a view illustrating a structure of a cell string and a page buffer of a NAND flash memory device.

A memory cell array 100 or a data storage region of a NAND flash memory device includes a plurality of cell strings 110, 120 respectively connected to corresponding bit lines BLe, BLo. While two cell strings are shown in FIG. 1, more cell strings can be provided in the memory cell array 100. One cell string 110 includes a drain selection transistor 111 connected to the bit line BLe, a source selection transistor 112 connected to a common source line CLS and a plurality of memory cell transistors 113, 114 disposed in series between the drain selection transistor 111 and the source selection transistor 112. A number of the memory cell transistors connected to one cell string may be thirty-two. More or less memory cell transistors may be provided according to the memory device.

The plurality of the memory cell transistors 113, 114 is alternately disposed in the cell string connected to the even bit line BLe and the odd bit line BLo. The even bit line BLe and the odd bit line BLo are connected to one page buffer 200.

The page buffer 200 functions as a sense amplifier during a read/verify operation, and functions as a driver driving the bit line according to the data to be programmed during a program operation. The page buffer 200 includes a bit line selection and bias circuit 210, a precharge circuit 220 and a register circuit 230.

The bit line selection and bias circuit 210 selects one of the even bit line BLe and the odd bit line BLo, and applies a preset bias to the selected bit line of the even bit line BLe and the odd bit line BLo.

The precharge circuit 220 precharges the selected bit line to a voltage of a certain level.

The register circuit 230 latches and stores the input data. While a page buffer adapted to a SLC structure is illustrated in the drawing, registers respectively latching and storing data of a least significant bit (LSB) and a most significant bit (MSB) are separately provided in the case of a MLC.

Figure 2:
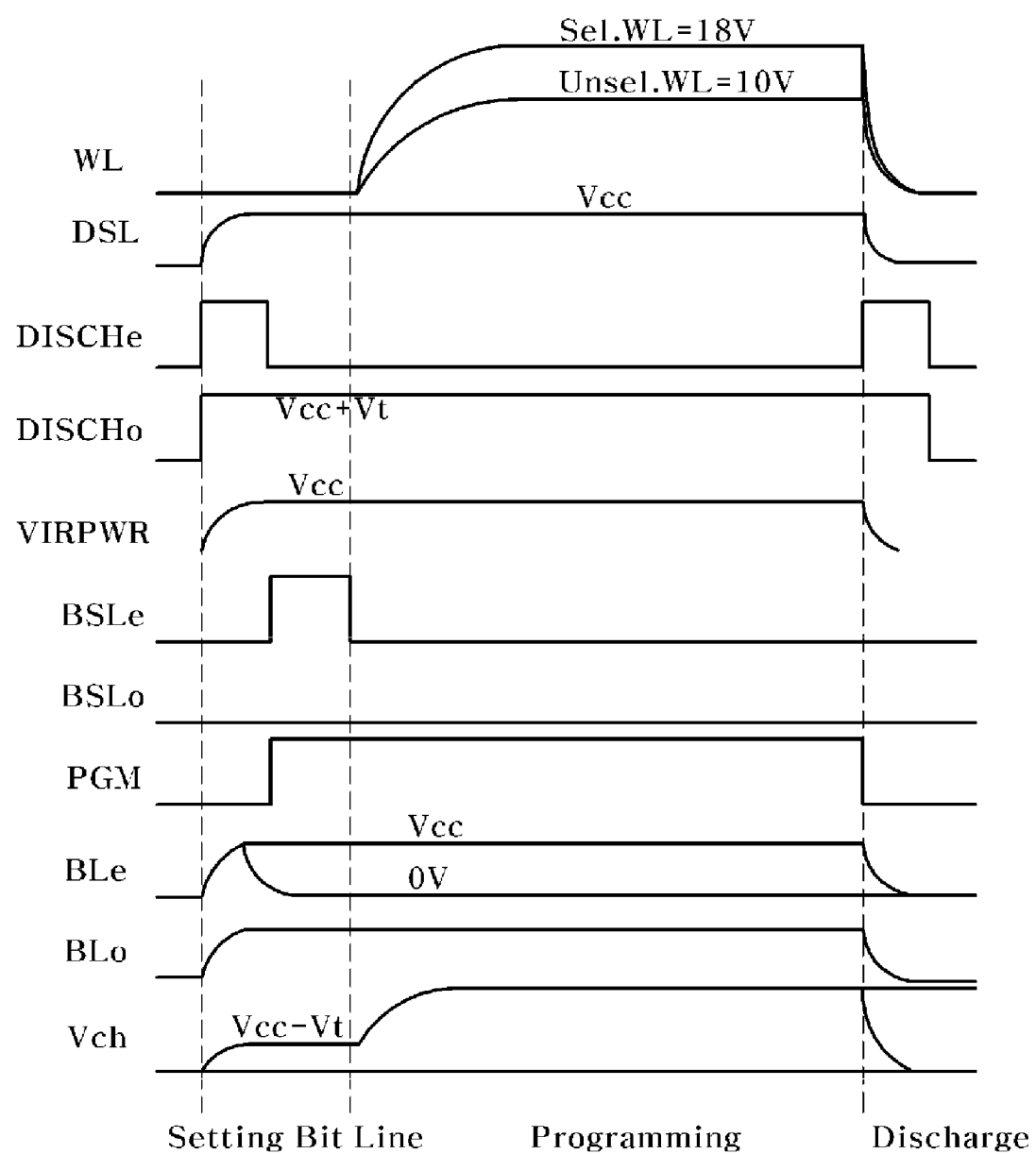
FIG. 2 is a timing diagram of a conventional self boosting program method.

FIG. 2 is a timing diagram of a program operation using self boosting.

Referring to FIGS. 1 and 2 together, a signal "high" is applied to a drain selection line (DSL) to turn on the drain selection transistor 111 and turn off the source selection transistor 112. The power voltage (Vcc) is applied to the bit line when the drain selection transistor 111 is turned on and the source selection transistor 112 is turned off. The channel of the memory cell is supplied with charges through the drain selection transistor 111 to be precharged to a value (Vcc−Vt) obtained by subtracting the threshold voltage (Vt) from the power voltage (Vcc). When the channel voltage (Vch) reaches Vcc−Vt, a signal "low" is applied to the DSL to turn off the drain selection transistor 111. The channel of the memory cell becomes a floated state. When the channel of the memory cell is floated, the program voltage (Vpgm) of about 18 V is applied to the selected word line and the fixed pass voltage (Vpass) of about 10 V is applied to the unselected word line. As the result, the voltage (Vch) of the channel is raised to the program inhibition voltage by coupling a capacitance between the word line and the channel.

Figure 3:
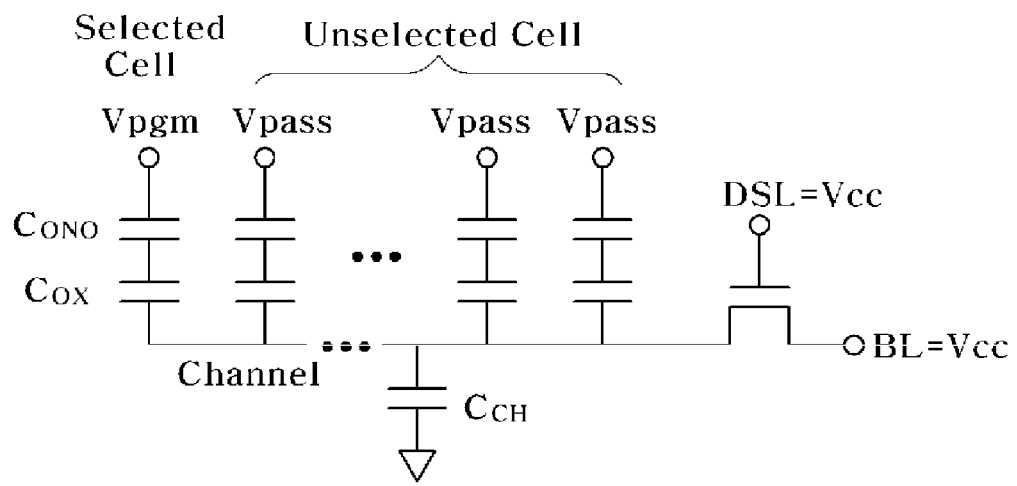
FIG. 3 is a view illustrating a circuit model of a cell string during a conventional programming operation of a NAND flash memory device.

FIG. 3 is a view illustrating a circuit model of a cell string during a programming operation of a NAND flash memory device.

As shown, each memory cell can be modeled such that a capacitance ($C_{ONO}$) between a control gate and a floating gate and a capacitance ($C_{OX}$) by a tunneling layer between the floating gate and the channel are serially connected. The channel capacitance ($C_{CH}$) is a sum of junction capacitances between an inversion region and a P well, and between a source/drain region and the P well of the remaining thirty-one memory cells except for the selected memory cell.

The channel voltage after the word line voltage is raised can be expressed by the following equation:

$$Vch=Vchi+\Delta V$$

Vchi refers to an initial voltage of the channel. The channel boosting voltage ($\Delta V$) varies depending on the state of the unselected memory cell. If all of the memory cells have a negative (−) threshold voltage, i.e. all of the memory cells are erased, all of the memory cells are already turned on before the word line voltage is raised and, thus, all of the channels are precharged to Vcc−Vt. The channel boosting voltage ($\Delta V$) is expressed by the following equation:

$$\Delta V=31yVpass+yVpgm$$

Here, y is a channel boost ratio and has a value of $C_{ONO}//C_{OX}/(31C_{ONO}//C_{OX}+C_{CH})$.

If the unselected memory cells have a positive (+) threshold voltage, i.e. they are programmed, the memory cells are turned on when the word line voltage is raised over Vth+Vchi. In this case, the boosting voltage of the channel is expressed by the following equation:

$$\Delta V=31y(Vpass-Vth-Vchi)+yVpgm$$

Therefore, it is necessary to increase the channel boost ratio in order to reduce the program disturbance by raising the channel voltage. The program disturbance can be reduced when a thickness of a tunnel oxide layer and a thickness of the interlayer insulation layer formed between the floating gate and the control gate are reduced and a doping concentration of the channel of the memory cell is lowered, or when the pass voltage applied to the word line of the memory cell that is unselected during the programming. However, the adjustment of all of these parameters should be determined by a trade-off between cell properties such as cell current and disturbance which unselected memory cells receive.

The present invention discloses a method for improving the disturbance property of the cell connected to an unselected string by increasing the pass voltage (Vpass) by a predetermined interval to increase the boosting voltage of the channel when the program voltage (Vpgm) exceeds a predetermined level or a program loop is performed more than a predetermined number of times.

In general, in the program operation according to the ISPP method, the program voltage (Vpgm) is increased step by step according to the program loop. Each program loop includes a program period and a program verify period. The program voltage (Vpgm) is increased by a determined step voltage ($\Delta V_1$) and the program time is maintained uniformly with respect to each program loop.

In the conventional ISPP method, since the pass voltage (Vpass) applied to the unselected memory cell is uniformly fixed, the channel boosting is sufficiently performed at a low program voltage but the boosted voltage becomes relatively insufficient with an increase in the program voltage. That is to say, the program voltage (Vpgm) is increased with each subsequent program loop. Since the channel bias of the memory cell is also fixed when the pass voltage (Vpass) is fixed, a gap between the program voltage and the channel bias is enlarged and the disturbance is generated in which the unselected memory cells adjacent to the selected memory cell are programmed. Therefore, it is possible to prevent the program disturbance by increasing the pass voltage (Vpass) to maintain the gap uniformly when the program voltage (Vpgm) exceeds a predetermined level and, thus, the gap between the program voltage and the channel bias exceeds a predetermined level.

Figure 4:
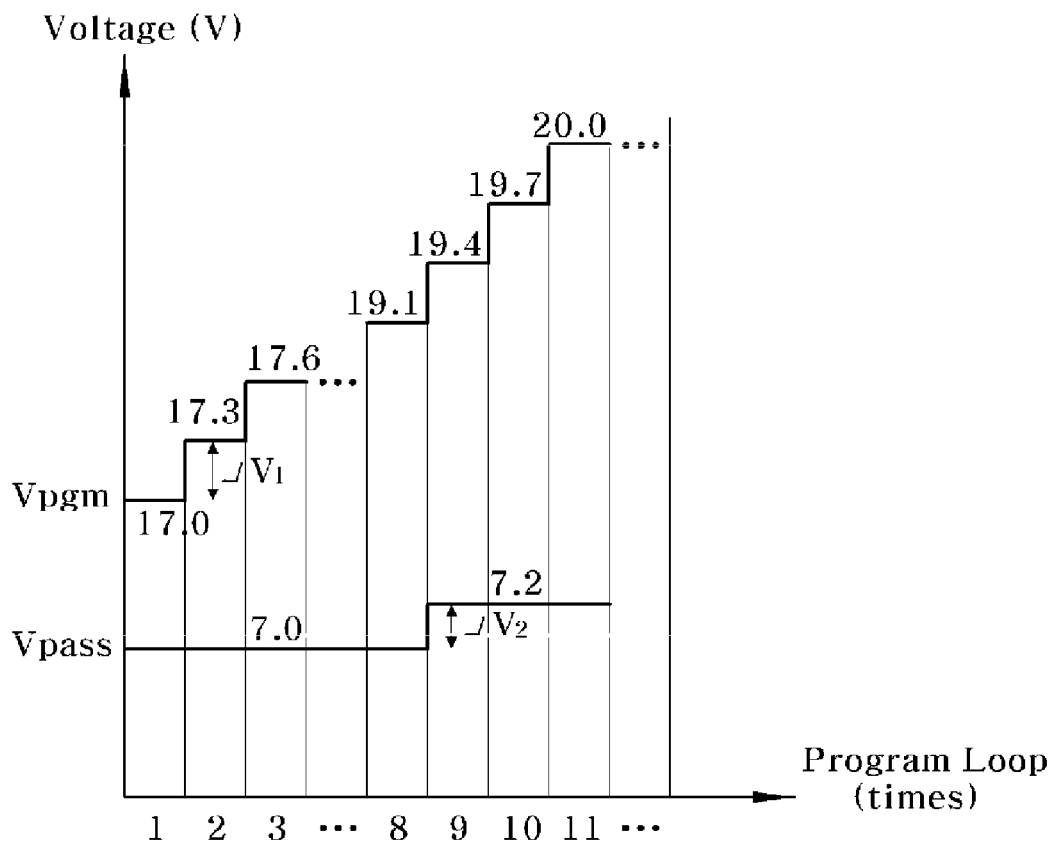
FIG. 4 is a view illustrating variation in a program voltage and a pass voltage during a programming operation of a flash memory device in accordance with an embodiment of the present invention.

FIG. 4 is a view illustrating variation in the program voltage and the pass voltage during a programming operation of a flash memory device in accordance with an embodiment of the present invention.

The programming is performed when a program starting voltage is set to 17 V and the pass voltage is set to 7.0 V and the program voltage is increased by a predetermined level, for example, by a step voltage ($\Delta V_1$) of 0.3 V as the number of times that the program loop is performed increases. When the number of times that the program loop is performed exceeds a predetermined amount, for example, after 8 times, or when the program voltage becomes more than 19 V, the pass voltage is also increased by a step voltage ($\Delta V_2$). As such, by increasing the pass voltage based on the program voltage or the program loop, the gap between the program voltage and the channel bias is maintained within a predetermined range, thereby preventing program disturbance.

However, when increasing the pass voltage from the initial stage of the programming, hot carrier injection can be caused since the depletion width of the channel is increased. In contrast, when the pass voltage is too low, the unselected memory cell is programmed by the Fowler-Nordheim Tunneling. Therefore, it is preferable to increase the pass voltage (Vpass) when the program voltage exceeds a predetermined level or the number of times that the program loop is performed exceeds a predetermined amount. Thus, a suitable bias difference can be maintained between the program voltage and the channel of the unselected memory cell.

Figure 5:
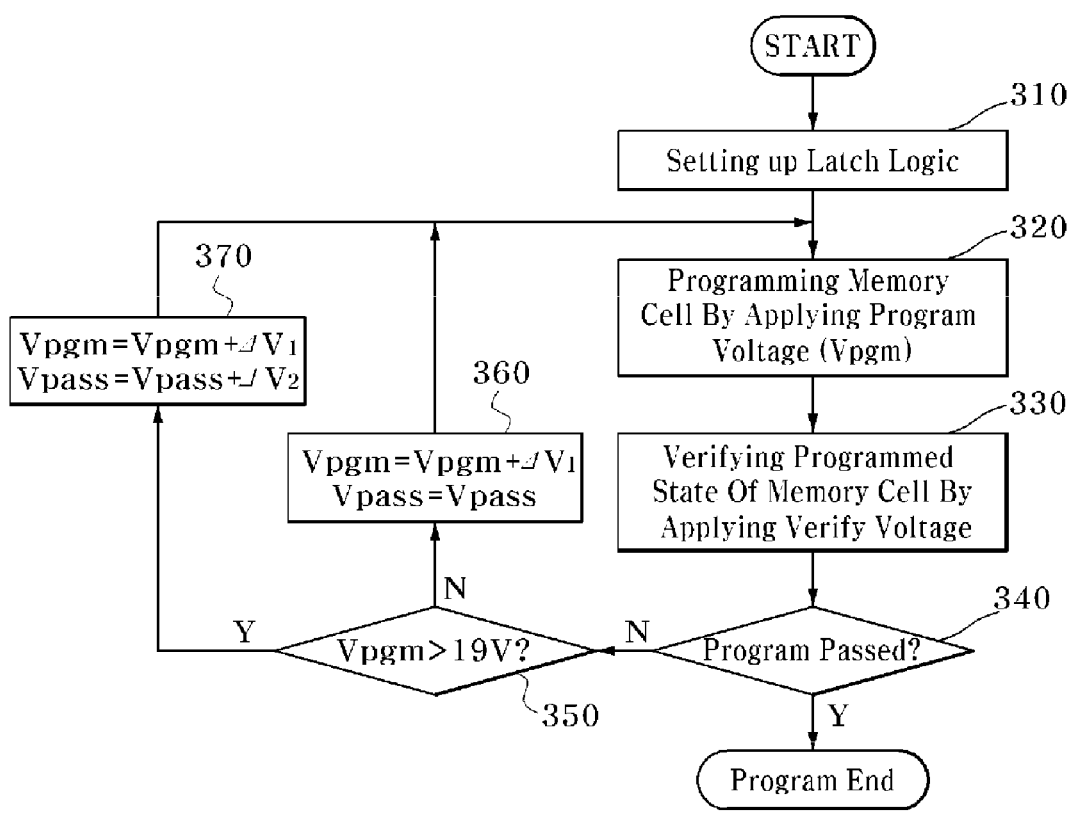
FIG. 5 is a flowchart illustrating a method of programming a NAND flash memory device in accordance with an embodiment of the present invention.

FIG. 5 is a flowchart illustrating a method of programming a NAND flash memory device in accordance with an embodiment of the present invention.

Referring to FIG. 5, latch logic is first set up (step 310). The latch logic includes a control circuit, for example, a page buffer, for applying a suitable bias to the memory cell, and for storing and latching the data in the memory cell. In this procedure, latching of the data including the program data is performed in a register within the page buffer. When the data latch is performed, the program voltage (Vpgm) is applied to the word line connected to the memory cell to be programmed (step 320). The pass voltage (Vpass) is applied to the word line of the unselected memory cell to prevent the unselected memory cell from being undesirably programmed. The pass voltage (Vpass) can be provided at a suitable level within a range, e.g. 7.0 to 11.0 V, for preventing the unselected memory cell from being programmed.

After the memory cell is programmed, a verify voltage is applied to verify that the selected memory cell is programmed to the desired level (step 330). As the result of the verification, a determination is made whether all of the memory cells passed the program step (step 340), and the programming operation is ended when all of the memory cells have passed the program step.

As a result of the verification, if a memory cell cannot be programmed to the suitable level and, thus, could not pass the program step, the program voltage (Vpgm) is increased by a predetermined step voltage ($\Delta V_1$) and the memory cell is programmed again. Before the memory cell is programmed again, a determination is made as to whether the program voltage (Vpgm) is over a predetermined level, e.g. 19 V (step 350). As described above, this prevents the channel boosting level from being decreased as the program voltage is increased, and also increases the pass voltage (Vpass) by a predetermined level when the program voltage (Vpgm) exceeds a predetermined level.

When the program voltage (Vpgm) applied to the word line of the memory cell is higher than the set level, e.g. 19 V, the program voltage (Vpgm) is increased by the first step voltage ($\Delta V_1$) and, at the same time, the pass voltage applied to the unselected memory cell is increased by the second step voltage ($\Delta V_2$) (step 370). Since the programming speed is faster as the levels of the first and second step voltages are increased but the width of the threshold voltage distribution also increases, the first and second step voltages can be provided at suitable levels in consideration of the programming speed and the width of the threshold voltage distribution. Also, the second step voltage $\Delta V_2$ can be lower than or equal to the first step voltage $\Delta V_1$. In a preferred embodiment, the second step voltage ($\Delta V_2$) can be 0.2 to 1.0 V.

When the program voltage (Vpgm) applied to the word line of the memory cell is not larger than the set level, e.g. 19 V, the program voltage (Vpgm) alone is increased by the first step voltage ($\Delta V_1$) without increasing the pass voltage (Vpass) (step 360). The operation of programming and verifying the memory cell is repeated until the memory cell passes the program step.

By varying the pass voltage (Vpass) according to the program voltage (Vpgm) applied to the selected memory cell, the boosting level of the channel can be increased to reduce the program disturbance. Therefore, the threshold voltage distribution of the memory cell is narrowed, and it is thus possible to enhance the operation property of the device.

The pass voltage (Vpass) applied to the unselected memory cell can be increased after the program loop is performed a predetermined number of times. In other words, it is possible to allow the pass voltage (Vpass) to be increased by a predetermined step voltage after the program loop is performed a predetermined times.

Figure 6:
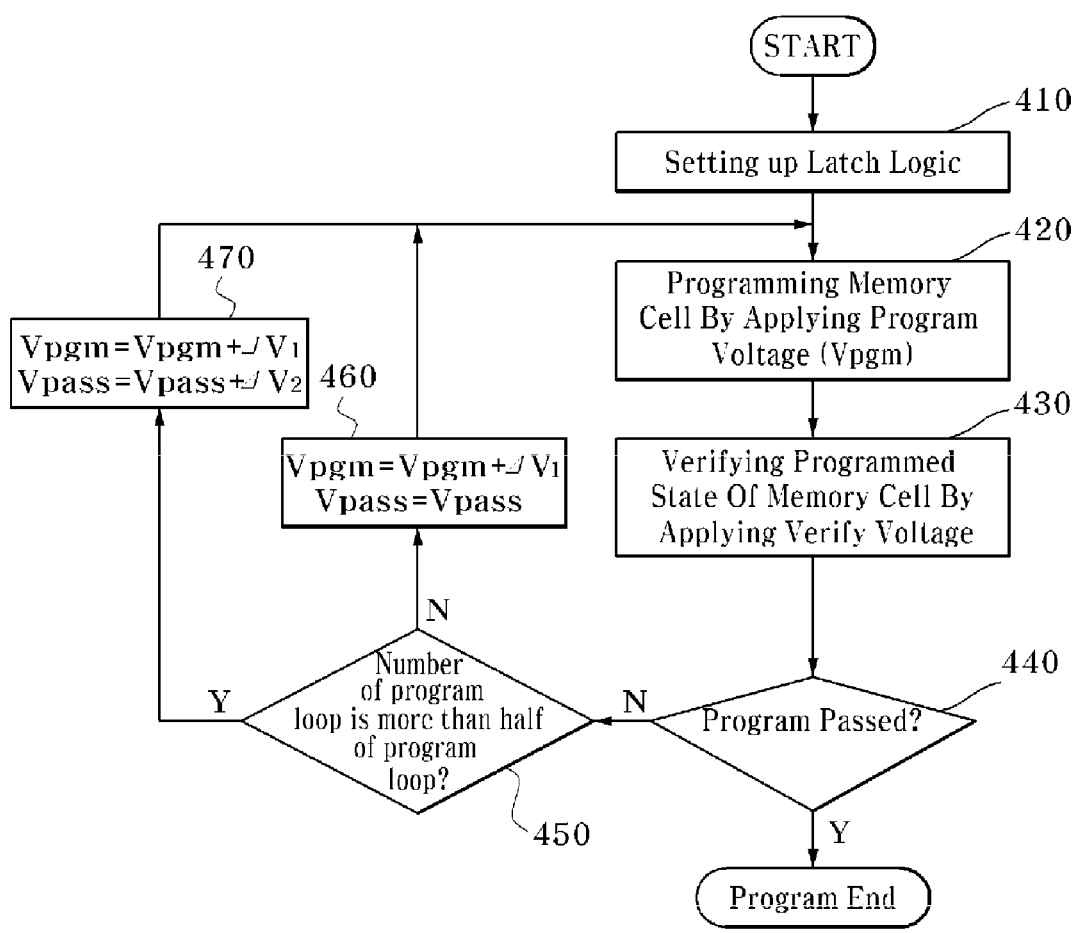
FIG. 6 is a flowchart illustrating a method of programming a NAND flash memory device in accordance with another embodiment of the present invention.

FIG. 6 is a flowchart illustrating a method of programming a NAND flash memory device in accordance with another embodiment of the present invention, in which the pass voltage is increased after the program loop is performed a predetermined number of times.

Referring to FIG. 6, a latch logic is first set up (step 410). The program voltage Vpgm is applied to the word line connected to the memory cell to be programmed (step 420). The pass voltage Vpass is applied to the word line of the unselected memory cell to prevent the unselected memory cell from being undesirably programmed. The pass voltage (Vpass) can be provided at a suitable level within a range, e.g. 7.0 to 11.0 V, for preventing the unselected memory cell from being programmed.

After the memory cell is programmed, a verify voltage is applied to verify that the selected memory cell is programmed to the desired level (step 430). As a result of the verification, a determination is made whether all of the memory cells passed the program step (step 440). The programming operation is ended when all of the memory cells have passed the program step.

As a result of the verification, if a memory cell could not pass the program step, i.e. when a memory cell cannot be programmed to the suitable level, the program voltage (Vpgm) is increased by a predetermined step voltage ($\Delta V_1$) and the memory cell is programmed again. Before the memory cell is programmed again, a determination is made whether the program step has been performed a predetermined times, e.g. 8 times (step 450). When the program step has been performed 8 times and a $9^{th}$ program pulse is to be applied, the program voltage Vpgm is increased by the first step voltage ($\Delta V_1$) and, at the same time, the pass voltage applied to the unselected memory cell is increased by the second step voltage ($\Delta V_2$) (step 470).

The first and second step voltages can be provided at suitable levels in consideration of the programming speed and the width of the threshold voltage distribution. Also, the second step voltage ($\Delta V_2$) can be lower than or equal to the first step voltage ($\Delta V_1$), and the second step voltage ($\Delta V_2$) can be 0.2 to 1.0 V. Further, the number of times that the program loop is performed after which the pass voltage Vpass is increased is not fixed to 8 times but can be varied according to properties of the memory device.

In the case of a flash memory device having a MLC structure in which the memory cell includes LSB and MSB, the LSB is first programmed and then programming of the MSB is performed according to the programmed state of the LSB. When the LSB and the MSB are programmed by the ISPP method, it is possible to reduce or prevent the program disturbance by increasing the pass voltage (Vpass), which is applied to the word line of the unselected memory cell, to a suitable level according to the program voltage or the program loop using the aforementioned method. In this case, the first and second step voltages can also be provided at suitable levels in consideration of the programming speed and the width of the threshold voltage distribution. Also, the second step voltage ($\Delta V_2$) can be lower than or equal to the first step voltage ($\Delta V_1$), and the second step voltage ($\Delta V_2$) can be 0.2 to 1.0 V. Alternatively, the level of the pass voltage (Vpass) can be increased according to the program verify voltage in the LSB or MSB programming operation.

While the present invention has been described with respect to specific embodiments, it will be apparent to those skilled in the art that various changes and modifications may be made without departing from the spirit and scope of the invention as defined in the following claims.

What is claimed is:

1. A method of programming a flash memory device using incremental step pulse programming (ISPP), the method comprising:
   applying a program voltage to a selected memory cell; and
   applying a pass voltage to unselected memory cells,
   wherein the pass voltage is increased to the unselected memory cells in response to the program voltage during a program loop of the ISPP to maintain a gap of a predetermined range between a channel voltage and a word line voltage of the unselected memory cell.

2. The method of claim 1, wherein the pass voltage is increased based on a level of the program voltage.

3. The method of claim 2, wherein the pass voltage is increased by a first step voltage when the level of the program voltage is higher than 19 V.

4. The method of claim 1, wherein the pass voltage is increased based on the number of program loop of the selected memory cell.

5. The method of claim 4, wherein the pass voltage is increased by a first step voltage after the program loop is performed half of a total number of program loop.

6. The method of claim 3, wherein the first step voltage is 0.2 to 1.0 V.

7. A method of programming a flash memory device, the method comprising:
- programming a selected memory cell by applying a program voltage to the selected memory cell and a pass voltage to unselected memory cells;
- verifying the selected memory cell;
- determining whether the level of the program voltage is higher than a first voltage, when the programming is not passed; and
- repeating the programming and verifying the selected memory cell by applying the program voltage gradually increased by a first step voltage to the selected memory cell and the pass voltage increased by a second step voltage to the unselected memory cells, respectively, until the programming is passed, when the program voltage is higher than the first voltage.

8. The method of claim 7, wherein the first voltage is approximately 19 V.

9. The method of claim 7, wherein the second step voltage is equal to or lower than the first step voltage.

10. The method of claim 7, wherein the second step voltage is 0.2 to 1.0 V.

11. The method of claim 5, wherein the first step voltage is 0.2 to 1.0 V.

12. The method of claim 4, wherein the number of program loop is approximately 8.

13. The method of claim 7, further comprising:
- repeating the programming and verifying the selected memory cell by applying the program voltage gradually increased by the first step voltage to the selected memory cell and the pass voltage to the unselected memory cells, when the program voltage is not higher than the first voltage.

14. A method of programming a flash memory device, the method comprising:
- programming a selected memory cell by applying a program voltage to the selected memory cell and a pass voltage to unselected memory cells;
- verifying the selected memory cell;
- determining whether the number of program loop is more than a first number; and
- repeating the programming and verifying the selected memory cell by applying the program voltage gradually increased by a first step voltage to the selected memory cell and the pass voltage increased by a second step voltage to the unselected memory cells, respectively, until the programming is passed when the number of the program loop is more than the first number.

15. The method of claim 14, wherein the first number is half of the total number of the program loop.

16. The method of claim 14, wherein the first number is approximately 8.

17. The method of claim 14, wherein the second step voltage is equal to or lower than the first step voltage.

18. The method of claim 14, wherein the second step voltage is 0.2 to 1.0 V.

19. The method of claim 14, further comprising:
- repeating the programming and verifying the selected memory cell by applying the program voltage gradually increased by the first step voltage to the selected memory cell and the pass voltage to the unselected memory cells, when the program loop is not more than the first number.

* * * * *